United States Patent
Ping

(10) Patent No.: US 11,263,508 B2
(45) Date of Patent: Mar. 1, 2022

(54) MODULAR NGSFF MODULE TO MEET DIFFERENT DENSITY AND LENGTH REQUIREMENTS

(71) Applicant: Samsung Electronics Co., Ltd., Suwon-si (KR)

(72) Inventor: Zhan Ping, San Jose, CA (US)

(73) Assignee: SAMSUNG ELECTRONICS CO., LTD.

(*) Notice: Subject to any disclaimer, the term of this patent is extended or adjusted under 35 U.S.C. 154(b) by 27 days.

(21) Appl. No.: 15/853,669

(22) Filed: Dec. 22, 2017

(65) Prior Publication Data
US 2019/0095774 A1 Mar. 28, 2019

Related U.S. Application Data

(60) Provisional application No. 62/562,350, filed on Sep. 22, 2017.

(51) Int. Cl.
*H05K 1/18* (2006.01)
*G06K 19/077* (2006.01)
*G06F 13/38* (2006.01)

(52) U.S. Cl.
CPC ..... *G06K 19/07732* (2013.01); *G06F 13/387* (2013.01); *H05K 1/18* (2013.01)

(58) Field of Classification Search
CPC .. H05K 1/18; H05K 7/14; H05K 7/20; H05K 7/1424–1427; G06K 19/07732;
(Continued)

(56) References Cited

U.S. PATENT DOCUMENTS 8,045,336 B2 10/2011 Huang et al.
10,064,305 B1* 8/2018 Zhai .................. H05K 7/1425
(Continued)

FOREIGN PATENT DOCUMENTS

CN 204462969 U 7/2015
TW 201721441 A 6/2017
TW I594108 B 8/2017

OTHER PUBLICATIONS

Wang, David, Next Generation Small Form Factor (NGSFF) SSD Proposal, Aug. 2017, Samsung Semiconductor Inc. (Year: 2017).*
(Continued)

*Primary Examiner* — Tuan T Dinh
(74) *Attorney, Agent, or Firm* — Renaissance IP Law Group LLP

(57) ABSTRACT

An assembly for a solid-state drive (SSD) includes a base printed circuit board having a PCIe adapter form factor, and at least one U.2 connector that is capable of being connected to a NGSFF device. The NGSFF device includes an NGSFF PCB, a first PCIe connector and a second PCIe connector. The NGSFF PCB is capable of receiving at least one SSD device and includes a first end and a second end in which the first end is opposite the second end. The first PCIe connector is at an edge of the first end of the NGSFF PCB and is capable of physical insertion into the at least one U.2 connector on the base PCB, and the second PCIe connector is at an edge of the second end of the NGSFF PCB and is capable of receiving a first PCIe connector of another NGSFF PCB.

17 Claims, 4 Drawing Sheets

(58) Field of Classification Search
CPC .. G06F 1/18; G06F 1/20187; G06F 13/40–42; G06F 13/48; G06F 13/4027; G06F 13/409; G06F 13/4068; G06F 13/18; G06F 13/185–187
USPC .................. 361/736–737, 752, 801–802
See application file for complete search history.

(56) References Cited

U.S. PATENT DOCUMENTS

| | | | | |
|---|---|---|---|---|
| 10,140,063 | B2* | 11/2018 | Worley | G06F 13/4081 |
| 10,255,215 | B2* | 4/2019 | Breakstone | G06F 13/4022 |
| 10,289,588 | B2* | 5/2019 | Chu | G06F 13/4022 |
| 10,467,170 | B2* | 11/2019 | McKnight | G06F 13/4068 |
| 10,520,994 | B2* | 12/2019 | Murillo | G06F 1/266 |
| 10,721,832 | B2* | 7/2020 | Nelson | H05K 7/1487 |
| 2005/0086413 | A1 | 4/2005 | Lee et al. | |
| 2009/0063895 | A1* | 3/2009 | Smith | G06F 11/2094 |
| | | | | 714/6.32 |
| 2010/0049914 | A1* | 2/2010 | Goodwin | G06F 3/0626 |
| | | | | 711/114 |
| 2013/0107443 | A1* | 5/2013 | Kim | G11C 5/04 |
| | | | | 361/679.32 |
| 2015/0277512 | A1 | 10/2015 | Davis et al. | |
| 2016/0259597 | A1* | 9/2016 | Worley | G06F 3/0613 |
| 2017/0011002 | A1 | 1/2017 | Shin | |
| 2017/0017600 | A1 | 1/2017 | Breakstone et al. | |
| 2017/0164501 | A1* | 6/2017 | Killen | G11B 33/128 |
| 2017/0168943 | A1* | 6/2017 | Chou | G06F 12/0246 |
| 2017/0269871 | A1* | 9/2017 | Khan | G06F 3/0673 |
| 2018/0210517 | A1* | 7/2018 | Yun | G06F 1/187 |
| 2018/0241140 | A1* | 8/2018 | Wang | G06F 1/185 |

OTHER PUBLICATIONS

Startech.com, U.2 to PCIe Adapter for 2.5" U.2 NVMe SSD—SFF-8639—x4 PCI Express 3.0, Jul. 5, 2017, https://web.archive.org/web/20170705044614/https://www.startech.com/HDD/Adapters/u2-pcie-adapter-nvme-ssd-PEX4SFF8639 (Year: 2017).*

* cited by examiner

MODULAR NGSFF MODULE TO MEET DIFFERENT DENSITY AND LENGTH REQUIREMENTS

CROSS-REFERENCE TO RELATED APPLICATION

This patent application claims the priority benefit under 35 U.S.C. § 119(e) of U.S. Provisional Patent Application No. 62/562,350, filed on Sep. 22, 2017, the disclosure of which is incorporated herein by reference in its entirety.

TECHNICAL FIELD

The subject matter disclosed herein generally relates to form factors for solid-state drives (SSDs), and more particularly, to a modular form factor for SSDs that may be hot swappable in a host system.

BACKGROUND

Non-volatile memory express (NVMe) storage devices are becoming popular for hyperscale server in datacenters, and NVMe storage devices are replacing legacy hard disk drives (HDDs) and legacy SSDs in datacenters.

SUMMARY

An embodiment provides an assembly for an SSD that may include a base printed circuit board (PCB) having a peripheral component interconnect express (PCIe) adapter form factor, and at least one U.2 connector capable of being connected to a next generation small form factor (NGSFF) device. The NGSFF device may include an NGSFF PCB, a first PCIe connector and a second PCIe connector. The NGSFF PCB may be capable of receiving at least one SSD device, and may include a first end and a second end in which the first end is opposite the second end. The first PCIe connector may be at an edge of the first end of the NGSFF PCB, and may be capable of physical insertion into the at least one U.2 connector on the base PCB. The second PCIe connector may be at an edge of the second end of the NGSFF PCB, and may be capable of receiving a first PCIe connector of another NGSFF PCB.

Another embodiment provides a SSD assembly that may include a base PCB, and a NGSFF device. The base PCB may include a PCIe form factor and at least one U.2 connector. The NGSFF device may include an NGSFF PCB, a first PCIe connector and a second PCIe connector. The NGSFF PCB may be capable of receiving at least one SSD device, and may include a first end and a second end in which the first end is opposite the second end. The first PCIe connector may be at an edge of the first end of the NGSFF PCB, and may be capable of physical insertion into the at least one U.2 connector on the base PCB. The second PCIe connector may be at an edge of the second end of the NGSFF PCB, and may be capable of receiving a first PCIe connector of another NGSFF PCB. The NGSFF device may be hot swappable to the base PCB.

Yet another embodiment provides an SSD assembly that may include a PCIe adapter card and at least one base PCB. The PCIe adapter card may include at least one first PCIe connector in which each first PCIe connector may be capable of receiving a second PCIe connector that is part of a base PCB. Each base PCB may include a first end and a second end in which the first end may be opposite the second end, at least one SSD device; the second PCIe connector at an edge of the first end of the base PCB; and a third PCIe connector at an edge of the second end of the base PCB in which the third PCIe connector may be capable of receiving a second PCIe connector of another base PCB. The second PCIe connector may include a plurality of PCIe lanes, and the third PCIe connector may include a plurality of PCIe lanes. The PCIe adapter card may include a half height, half length (HHHL) form factor. In one embodiment, the PCIe adapter card may further include a panel having an opening through which at least one base PCB may be hot swappable to the first PCIe connector on the PCIe adapter card.

BRIEF DESCRIPTION OF THE DRAWINGS

In the following section, the aspects of the subject matter disclosed herein will be described with reference to exemplary embodiments illustrated in the figures, in which.

DETAILED DESCRIPTION

Figure 1A:
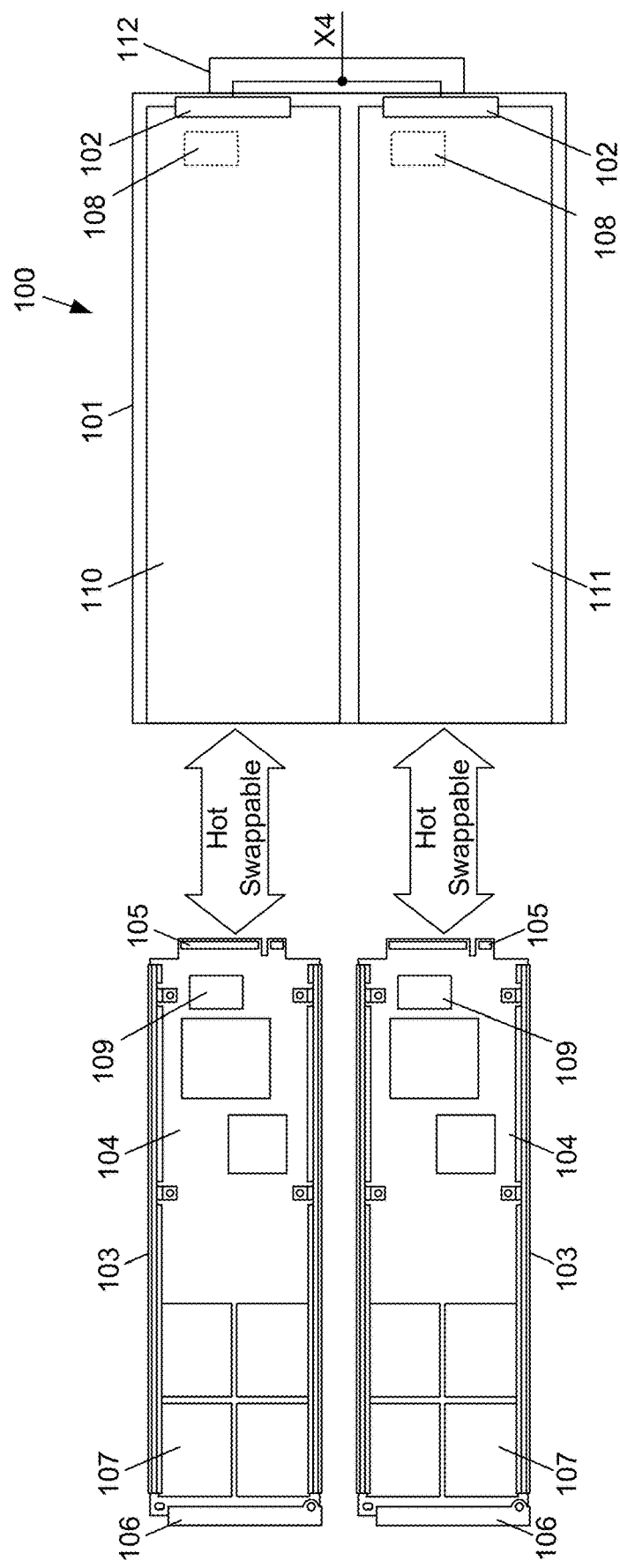
FIG. 1A depicts two NGSFF form-factor modules with respect to an adapter assembly device according to the subject matter disclosed herein.

In the following detailed description, numerous specific details are set forth in order to provide a thorough understanding of the disclosure. It will be understood, however, by those skilled in the art that the disclosed aspects may be practiced without these specific details. In other instances, well-known methods, procedures, components and circuits have not been described in detail not to obscure the subject matter disclosed herein.

Reference throughout this specification to "one embodiment" or "an embodiment" means that a particular feature, structure, or characteristic described in connection with the embodiment may be included in at least one embodiment disclosed herein. Thus, the appearances of the phrases "in one embodiment" or "in an embodiment" or "according to one embodiment" (or other phrases having similar import) in various places throughout this specification may not be necessarily all referring to the same embodiment. Furthermore, the particular features, structures or characteristics may be combined in any suitable manner in one or more embodiments. In this regard, as used herein, the word "exemplary" means "serving as an example, instance, or illustration." Any embodiment described herein as "exemplary" is not to be construed as necessarily preferred or advantageous over other embodiments. Also, depending on the context of discussion herein, a singular term may include the corresponding plural forms and a plural term may include the corresponding singular form. It is further noted that various figures (including component diagrams) shown and discussed herein are for illustrative purpose only, and are not drawn to scale. Similarly, various waveforms and timing diagrams are shown for illustrative purpose only. For example, the dimensions of some of the elements may be exaggerated relative to other elements for clarity. Further, if considered appropriate, reference numerals have been repeated among the figures to indicate corresponding and/or analogous elements.

The terminology used herein is for the purpose of describing particular exemplary embodiments only and is not intended to be limiting of the claimed subject matter. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. The terms "first," "second," etc., as used herein, are used as labels for nouns that they precede, and do not imply any type of ordering (e.g., spatial, temporal, logical, etc.) unless explicitly defined as such. Furthermore, the same reference numerals may be used across two or more figures to refer to parts, components, blocks, circuits, units, or modules having the same or similar functionality. Such usage is, however, for simplicity of illustration and ease of discussion only; it does not imply that the construction or architectural details of such components or units are the same across all embodiments or such commonly-referenced parts/modules are the only way to implement the teachings of particular embodiments disclosed herein.

Unless otherwise defined, all terms (including technical and scientific terms) used herein have the same meaning as commonly understood by one of ordinary skill in the art to which this subject matter belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The subject matter disclosed herein provides an adapter assembly device that may be capable of receiving one or more next generation small form factor (NGSFF) modules. In one embodiment, the adapter assembly device may be capable of receiving an NGSFF module that may include SSDs that provide high density and high performance for an existing server storage. Additionally, SSDs configured to have an NGSFF may be connected to an adapter assembly device having U.2 connectors.

In one embodiment, an adapter assembly device may be capable of receiving an NGSFF module that may include a card-edge connector on one end, and a female connector on the other end that also accepts the card-edge connector of an NGSFF module, so that NGSFF modules may be plugged into each other end-on-end in a cascaded-type manner. Thus, combined SSD devices may have a form factor that may be longer than the length of a single NGSFF by plugging NGSFF modules together. Consequently, different embodiments of the modular NGSFF may be configured to the different lengths and density requirements in order to adapt to different applications. For example, a single NGSFF SSD module may be used for a storage-server application, whereas two NGSFF SSD form-factor modules may be connected together and used for a storage-drawer application.

An adapter assembly device disclosed herein configured like a peripheral component interconnect express (PCIe) adapter and that is capable of receiving an NGSFF module enables a user to add hot-pluggable high-density, high-performance NVMe storage devices to any existing storage server that includes, for example, a PCIe slot in a host computer. That is, an adapter assembly device disclosed herein may be configured as a PCIe adapter card that may be capable of conveniently receiving one or more hot-swappable NGSFF SSD modules without removing the entire PCIe adapter card from the host device. The hot-swappability of an NGSFF module may be provided by a connector on the PCIe adapter card that permits an NGSFF module to be inserted either into the top of the PCIe adapter card or through a rear panel edge. For example, in one embodiment, a closeable opening may be provided in a rear panel of a PCIe adapter card in which the closeable opening is accessible when the PCIe adapter card is plugged into a PCIe slot of a host device. Such a configuration allows a user to open the closeable opening of the PCIe adapter card and an NGSFF module without needing to remove the PCIe adapter card.

FIG. 1A depicts an adapter assembly device 100 and two NGSFF modules 103 according to the subject matter disclosed herein. In one embodiment, the adapter assembly device 100 may include a base printed circuit board (PCB) 101 and one or more conventional U.2 connectors 102 that are each configured to receive an NGSFF module 103. The adapter assembly device 100 may have a selectable form factor that may be based on a given application. For example, in one embodiment, the form factor of the adapter assembly device 100 may be configured to have a PCIe form factor. In another embodiment, the form factor of the adapter assembly device 100 may be in the shape of a PCIe adapter. In still another embodiment, the adapter assembly device 100 may have the form factor of a standard 2.5 or 3.5 inch drive.

Each NGSFF module 103 may include a base PCB 104, a card-edge connector 105 at one end of the PCB 104, and a connector 106 at an end of the PCB 104 that is opposite from the card-edge connector 105. The connector 106 may be configured to receive a card-edge connector of another NGSFF module (not shown). In one embodiment, both of the card-edge connector 105 and the connector 106 may be configured for a plurality of PCIe lanes. For example, both the card-edge connector 105 and the connector 106 may be configured to provide a PCIe 2× interface. In another example, both of the card-edge connector 105 and the connector 106 may be configured for a PCIe 4× interface.

In one embodiment, the adapter assembly device 100 may have a form factor that is configured to receive at least one NGSFF module 103, which is about 110 mm×30.5 mm. In another embodiment, the adapter assembly device 100 may have a form factor that is configured to receive at least two NGSFF modules 103.

In one embodiment, an NGSFF module 103 may include one or more SSD memory devices 107. In one embodiment, an NGSFF module 103 may include up to 32 TB of NVMe storage capacity, and may also provide about a 1M random-read IOPS. It should be understood, however, that an embodiment of an NGSFF module 103 may include more than 32 TB of NVMe storage and/or may provide more random-read IOPS.

Each of the NGSFF modules 103 may be separately hot swappable to a corresponding U.2 connector 102 on the adapter assembly device 100. In one embodiment, at least one U.2 connector 102 may include a pre-charge pin and other pins have a staging to support hot swappability of the NGSFF modules 103. In another embodiment, at least one U.2 connector 102 may include pins that are staggered to ensure that no sensitive circuitry in an NGSFF module 103 is connected to power before a reliable system ground has been established. In another embodiment, at least one U.2 connector 102 may include pins that are staggered so that the ground of an NGSFF module 103 is established first, then data lines are connected, and power lines are connected last. Additionally or alternatively, the adapter assembly device 100 may include one or more optional hot-swap controllers 108 that may be embedded in or mounted on the backside of the adapter assembly device 100 that may control in-rush current into and voltage applied to an NGSFF module 103 that has been hot-swapped into a U.2 connector 102. Also additionally or alternatively, an NGSFF module 103 may include a hot-swap controller 109 that may control in-rush current into and voltage applied to the NGSFF module 103.

Reference numerals 110 and 111 in FIG. 1A conceptually indicate example locations on the adapter assembly device 100 where an NGSFF module 103 may be positioned when connected to a U.2 connector 102. The adapter assembly device 100 may include a connector 112 through which the PCIe lanes may be connected to a host device (not shown). It should be understood that another embodiment of an adapter assembly device 100 may include only one location where an NGSFF device 103 may be positioned when connected to the adapter assembly device 100.

Figure 1C:
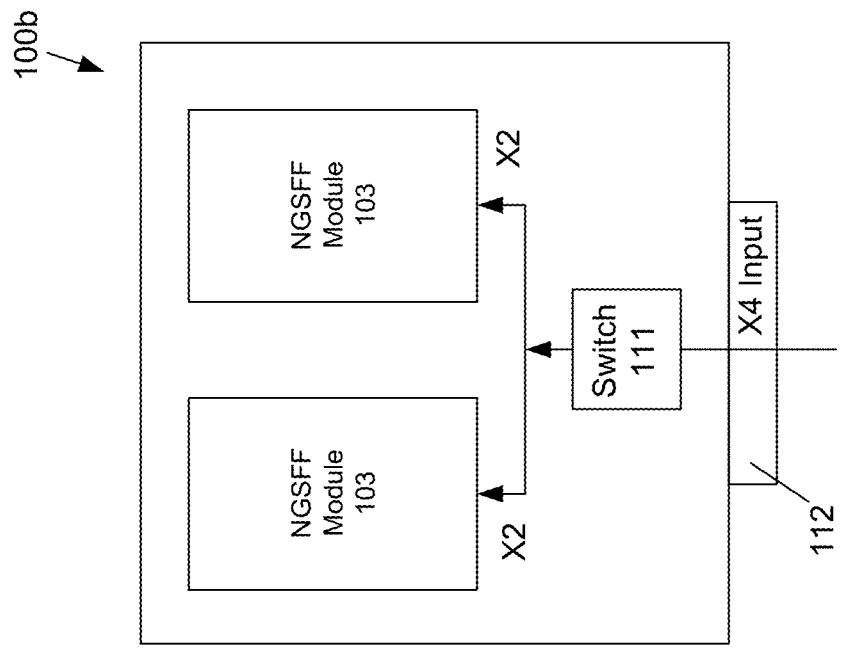
FIGS. 1B and 1C respectively depict two alternative example embodiments of NGSFF form-factor modules with respect to an adapter assembly device according to the subject matter disclosed herein.
Figure 1B:
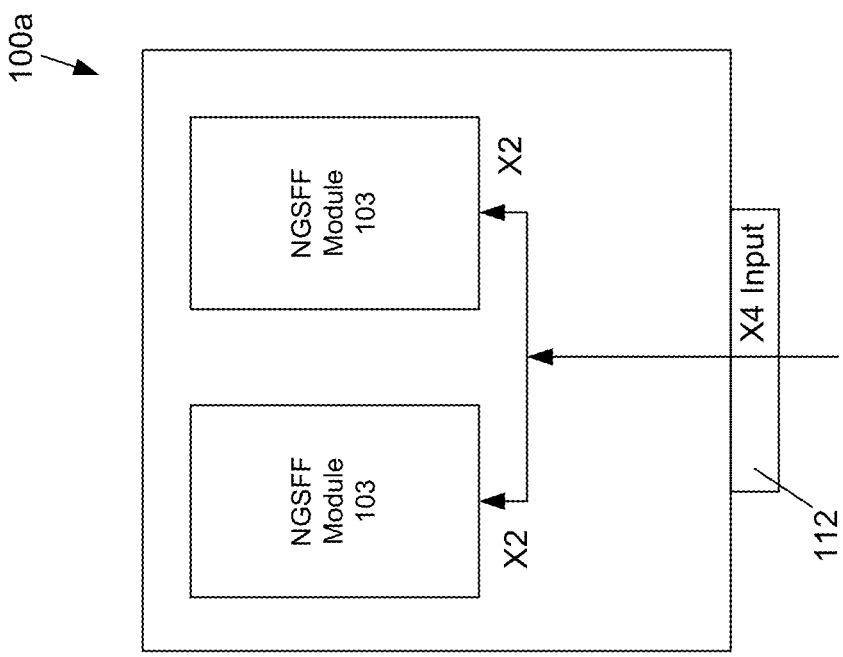

FIGS. 1B and 1C respectively depict two alternative example embodiments of adapter assembly devices 100a and 100b and NGSFF modules 103. In FIG. 1B, the adapter assembly device 100a may be configured so that a PCIe 2× interface of an NGSFF module 103 may be directly connected to a host device (not shown) that is external to the adapter assembly device 100a. In FIG. 1C, the adapter assembly device 100b may be configured with a controllable switch 113 between the PCIe 2× interface of an NGSFF module 103 and a host device (not shown) that is external to the U.2 form-factor device 100b.

Figure 2A:
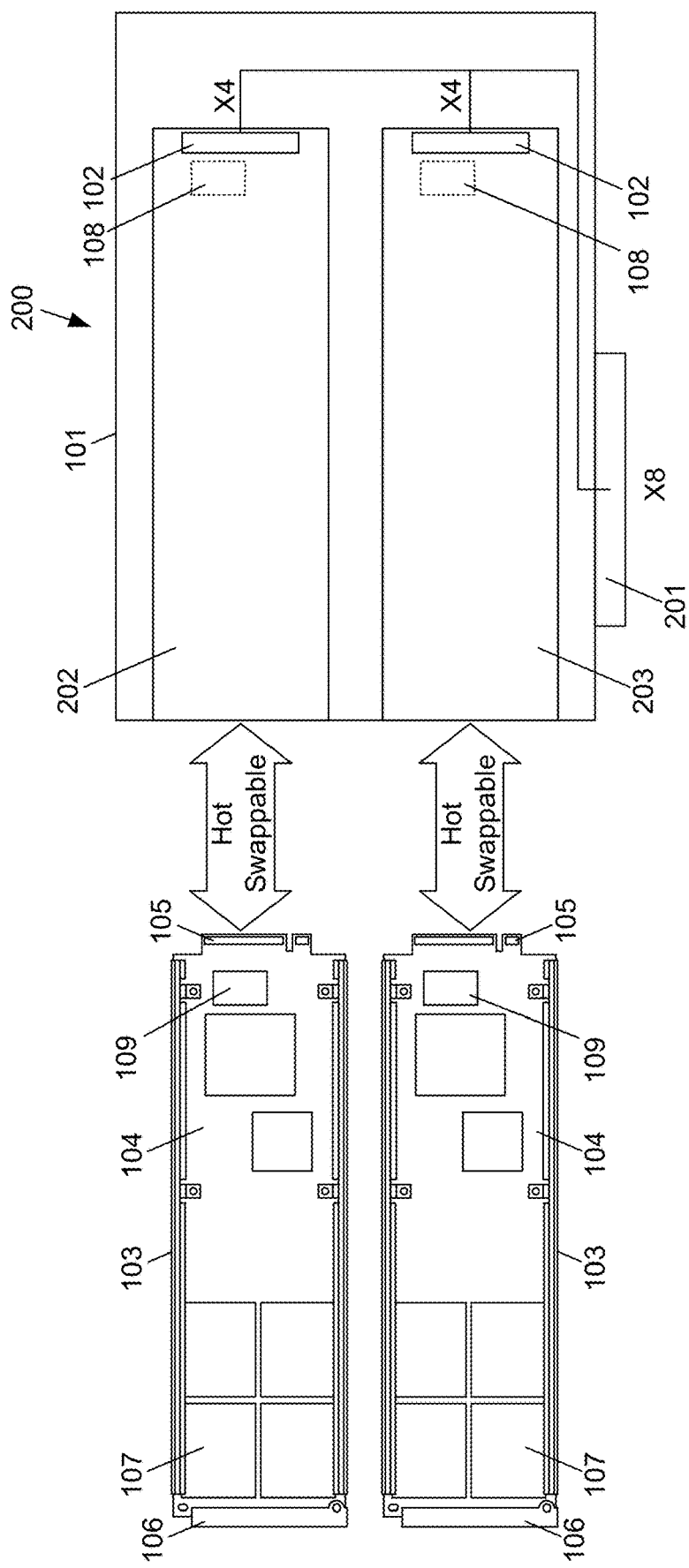
FIG. 2A depicts an example embodiment of a PCIe adapter card that may be configured to receive one or more NGSFF form-factor modules.

FIG. 2A depicts an example embodiment of a PCIe adapter card 200 that may be configured to receive one or more NGSFF form-factor modules 103 according to the subject matter disclosed herein. In one embodiment, an NGSFF SSD form-factor module 103 may be configured to include up to 32 TB of NVMe storage capacity and may provide about a 1M random read IOPS to any server system having PCIe slot. The PCIe adapter card 200 may be configured to have a half height, half length (HHHL) form factor (i.e., nominally 64.40 mm wide×167.65 mm long× 14.47 mm deep). In one embodiment, the PCIe adapter card 200 may include a card-edge connector 201 that provides a Gen3 X8 interface. Reference numerals 202 and 203 conceptually indicate example locations on the PCIe adapter card 200 where an NGSFF module 103 may be positioned when connected to the PCIe adapter card 200. It should be understood that another embodiment of the PCIe adapter card 200 may include only one location where an NGSFF device 103 may be positioned when connected to the PCIe adapter card 200.

Figure 2B:
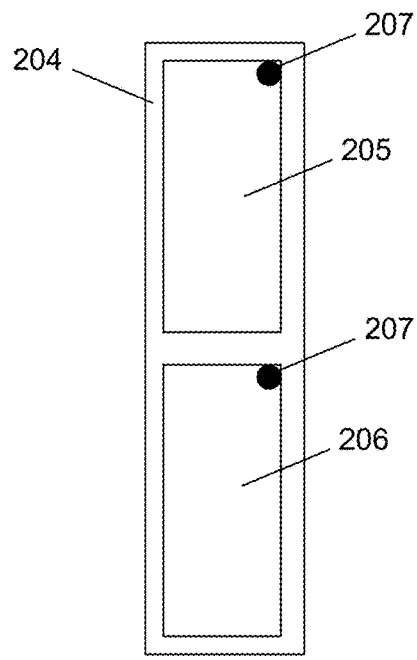
FIG. 2B conceptually depicts possible locations for closeable openings on a rear panel 204 of an adapter assembly device configured as a PCIe adapter card according to the subject matter disclosed herein.

The PCIe adapter card 200 may receive one or more NGSFF modules 103 that may be hot-pluggable to a mating connector (not shown) on the PCIe adapter card 200. In one embodiment, the PCIe adapter card 200 may include a rear panel that has one or more closeable openings that allow a user to selectively plug in or remove one or more NGSFF modules 103, thereby providing convenient serviceability and flexible system configuration. FIG. 2B conceptually depicts possible locations 205 and 206 for closeable openings on a rear panel 204 of a PCIe adapter card 200. In one embodiment, the openings may include a hinged door. In another embodiment, the openings may be closeable using a plug that may be inserted into the opening. In still another embodiment, the openings may not be closeable. Accordingly, unlike a conventional SSD PCIe adapter card, the PCIe adapter card 200 disclosed herein does not require a user to open a server lid to remove the PCIe adapter card in order to remove an SSD device that is part of an NGSFF module 103 connected to the PCIe adapter card for service. Additionally, an NGSFF SSD 103 may contain one or more LEDs 207 (FIG. 2B) that may be visible through the rear panel 204 of the PCIe adapter card 200 to indicate activity status. In an alternative embodiment, the PCIe adapter card 200 may be configured so that an NGSFF module may be inserted into the PCIe adapter card from a top direction.

Figure 2C:
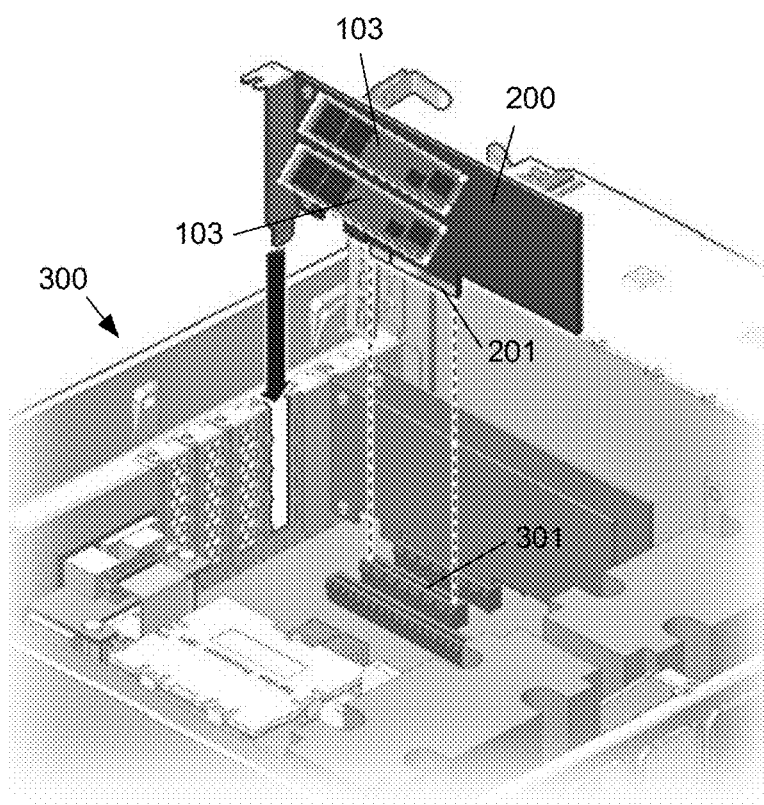
FIG. 2C depicts a perspective view of an adapter assembly device configured as a PCIe adapter card with respect to a host device into which the PCIe adapter card may be inserted according to the subject matter disclosed herein.

FIG. 2C depicts a perspective view of a PCIe adapter card 200 with respect to a host device 300 into which a PCIe adapter card 200 may be inserted according to the subject matter disclosed herein. The card-edge connector 201 of the PCIe adapter card 200 is indicated as being insertable into a corresponding mating connector 301 on a motherboard 302 of the host device 300. In another alternative embodiment, a PCIe adapter card 200 may be configured to include a housing that matches a conventional 2.5" or 3.5" hard disk drive (HDD) form factor, thereby allowing NGSFF SSDs to be used in legacy datacenter equipment.

As will be recognized by those skilled in the art, the innovative concepts described herein can be modified and varied over a wide range of applications. Accordingly, the scope of claimed subject matter should not be limited to any of the specific exemplary teachings discussed above, but is instead defined by the following claims.

What is claimed is:

1. An assembly for a solid-state drive (SSD), comprising:
a peripheral component interconnect express (PCIe) adapter card comprising a base printed circuit board (PCB) having a card-edge connector to insert into a mating connector on a host device;
a first U.2 connector to connect a first memory module device; and
a second U.2 connector to connect a second memory module device;
wherein the first and second U.2 connectors are arranged on the base PCB to position the first and second memory module devices parallel on the base PCB;
wherein the first and second U.2 connectors are substantially perpendicular to the card-edge connector;
wherein the first memory module device comprises:
a second PCB to receive at least one SSD device, the second PCB comprising a first end and a second end, the first end being opposite the second end;
a first PCIe connector at an edge of the first end of the second PCB, the first PCIe connector arranged to be physically inserted into the first U.2 connector on the base PCB;
a second PCIe connector at an edge of the second end of the second PCB, the second PCIe connector to receive a first PCIe connector of another second PCB; and
wherein the first memory module device is hot swappable to the base PCB.

2. The assembly of claim 1, further comprising at least one SSD device.

3. The assembly of claim 1, wherein the first PCIe connector includes a plurality of PCIe lanes.

4. The assembly of claim 1, wherein the PCIe adapter card comprises a half height, half length (HHHL) form factor.

5. The assembly of claim 1, wherein the PCIe adapter card further comprises a panel comprising an opening through which a memory module device is hot swappable to the first U.2 connector on the PCIe adapter card.

6. The assembly of claim 1, further comprising a controller configured to control an in-rush to the first memory module device.

7. An assembly for a solid-state drive (SSD), comprising:
   a peripheral component interconnect express (PCIe) adapter card comprising a base printed circuit board (PCB) having a card-edge connector to insert into a mating connector on a host device;
   a first U.2 connector to connect a first memory module device;
   a second U.2 connector to connect a second memory module device; and
   at least one SSD device;
   wherein the first and second U.2 connectors are arranged on the base PCB to position the first and second memory module devices parallel on the base PCB;
   wherein the first and second U.2 connectors are substantially perpendicular to the card-edge connector;
   wherein the first memory module device comprises:
      a second PCB to receive the at least one SSD device, the second PCB comprising a first end and a second end, the first end being opposite the second end;
      a first PCIe connector at an edge of the first end of the second PCB, the first PCIe connector arranged to be physically inserted into the first U.2 connector on the base PCB; and
      a second PCIe connector at an edge of the second end of the second PCB, the second PCIe connector to receive a first PCIe connector of another second PCB; and
   wherein the second PCB is hot swappable to the base PCB.

8. A solid-state drive (SSD) assembly, comprising:
   a base printed circuit board (PCB) comprising a peripheral component interconnect express (PCIe) form factor, a first U.2 connector, a second U.2 connector, and a card-edge connector capable of being inserted into a mating connector on a host device; and
   a first memory module device, the first memory module device comprising:
      a second PCB capable of receiving at least one SSD device, the second PCB comprising a first end and a second end, the first end being opposite the second end;
      a first PCIe connector at an edge of the first end of the second PCB, the first PCIe connector being capable of physical insertion into the first U.2 connector on the base PCB; and
      a second PCIe connector at an edge of the second end of the second PCB, the second PCIe connector being capable of receiving a first PCIe connector of another second PCB;
   wherein the first and second U.2 connectors are arranged on the base PCB to position the first memory module device and a second memory module device parallel on the base PCB;
   wherein the first and second U.2 connectors are substantially perpendicular to the card-edge connector; and
   wherein the first memory module device is hot swappable to the base PCB.

9. The SSD assembly of claim 8, wherein the first PCIe connector includes a plurality of PCIe lanes, and wherein the second PCIe connector includes a plurality of PCIe lanes.

10. The SSD assembly of claim 8, wherein the base PCB comprises a PCIe adapter card.

11. The SSD assembly of claim 9, wherein the base PCB comprises a PCIe adapter card.

12. The SSD assembly of claim 10, wherein the PCIe adapter card comprises a half height, half length (HHHL) form factor.

13. The SSD assembly of claim 10, wherein the PCIe adapter card further comprises a panel comprising an opening through which the first memory module device is hot swappable to the first U.2 connector.

14. A solid-state drive (SSD) assembly, comprising:
   a peripheral component interconnection express (PCIe) adapter card comprising a first U.2 connector and a second U.2 connector, the PCIe adapter card further comprising a card-edge connector capable of being inserted into a mating connector on a host device; and
   a first base PCB and a second base PCB, each base PCB comprising:
      a first end and a second end, the first end being opposite the second end, the first end being configured to connect to one of the U.2 connectors on the PCIe adapter card;
      at least one SSD device; and
      a first PCIe connector at an edge of the second end of the first or second base PCB, the first PCIe connector being capable of receiving a second PCIe connector of a third base PCB;
   wherein the first and second U.2 connectors are arranged on the PCIe adapter card to position the first and second base PCBs parallel on the PCIe adapter card;
   wherein the first and second U.2 connectors are substantially perpendicular to the card-edge connector; and
   wherein at least one base PCB is hot swappable to one of the U.2 connectors on the PCIe adapter card.

15. The SSD assembly of claim 14, wherein the first U.2 connector includes a plurality of PCIe lanes, and
   wherein the second U.2 connector includes a plurality of PCIe lanes.

16. The SSD assembly of claim 15, wherein the PCIe adapter card comprises a half height, half length (HHHL) form factor.

17. The SSD assembly of claim 16, wherein the PCIe adapter card further comprises a panel comprising an opening through which the at least one base PCB is hot swappable.

* * * * *